(12) United States Patent
Hsu et al.

(10) Patent No.: US 7,732,062 B1
(45) Date of Patent: Jun. 8, 2010

(54) CHARGE TRANSPORT LAYERS AND ORGANIC ELECTRON DEVICES COMPRISING SAME

(75) Inventors: Che-Hsiung Hsu, Wilmington, DE (US); Weiying Gao, Landenberg, PA (US); Hong Meng, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 1168 days.

(21) Appl. No.: 11/319,940

(22) Filed: Dec. 28, 2005

Related U.S. Application Data

(60) Provisional application No. 60/640,540, filed on Dec. 30, 2004, provisional application No. 60/694,939, filed on Jun. 28, 2005.

(51) Int. Cl.
*A61K 31/498* (2006.01)
(52) U.S. Cl. .................. 428/690; 544/353; 427/384
(58) Field of Classification Search ............... None
See application file for complete search history.

(56) References Cited

U.S. PATENT DOCUMENTS

| | | | |
|---|---|---|---|
| 6,303,238 B1 | 10/2001 | Thompson et al. | 428/690 |
| 6,337,753 B1 | 1/2002 | Goossen | |
| 7,023,611 B2 | 4/2006 | Huang et al. | |
| 2001/0019782 A1 | 9/2001 | Igarashi et al. | 428/690 |
| 2002/0003647 A1 | 1/2002 | Tsuritani et al. | |
| 2003/0039006 A1 | 2/2003 | Carbone et al. | |
| 2004/0077860 A1* | 4/2004 | Herron et al. | 544/353 |
| 2004/0086743 A1* | 5/2004 | Brown et al. | 428/690 |

FOREIGN PATENT DOCUMENTS

| | | |
|---|---|---|
| EP | 1 191 612 A2 | 3/2002 |
| EP | 1 191 614 A2 | 3/2002 |
| WO | WO 00/70655 | 11/2000 |
| WO | WO 01/41512 A1 | 6/2001 |
| WO | WO 02/02714 A2 | 1/2002 |
| WO | WO 02/15645 A1 | 2/2002 |

OTHER PUBLICATIONS

Samoc et. al., J. Phys. C.:Solid St. Phys., 13 (1980) 4419-4424.*
Webb et. al., J. Phys. C.:Solid St. Phys., 12 (1979) 9 3173-3183.*
Gustafsson, G. et al., "Flexible Light-Emitting Diodes made from Soluble Conducting Polymer", *Nature*, 1992, 357, 477-479.
O'Brien, D.F. et al., "Electrophosphoresence from a Doped Polymer Light Emitting Diode", *Synthetic Metals*, 2001, 116(1-3), 379-383.
Campbell, I.H. et al., "Excitation Transfer Processes in a phosphor-doped poly (p-phenylene vinylene) Light-Emitting Diode" *Physical Review B* , 65, 085210-1-085210-8.
Othmer, K., *Encyclopedia of Chemical Technology*, 1996, 18 (4th Ed), 837-860.
In the United States Patent and Trademark Office, Non-Final Office Action in re:. U.S. Appl. No. 11/150,606, filed Jun. 10, 2005, Dated Apr. 7, 2009, 9 pages.

* cited by examiner

*Primary Examiner*—D. Lawrence Tarazano
*Assistant Examiner*—Gregory Clark
(74) *Attorney, Agent, or Firm*—Woodcock Washburn LLP

(57) ABSTRACT

Provided are organic n-doped electron transport layers comprising at least one electron transport material and at least one electron rich dopant material and organic p-doped hole injection layers comprising at least one hole transport material and at least one electron deficient dopant material.

11 Claims, 1 Drawing Sheet

CHARGE TRANSPORT LAYERS AND ORGANIC ELECTRON DEVICES COMPRISING SAME

CROSS-REFERENCE TO RELATED APPLICATIONS

The present application claims benefit to U.S. Provisional Application Ser. Nos. 60/640,540, filed Dec. 30, 2004 and 60/694,939, filed Jun. 28, 2005, each of which are incorporated herein by reference in their entireties.

FIELD OF THE DISCLOSURE

This disclosure relates generally to electronic devices comprising charge transport layers.

BACKGROUND INFORMATION

Organic electronic devices convert electrical energy into radiation, detect signals through electronic processes, or convert radiation into electrical energy. Organic Light Emitting Diodes (OLEDs) are one class of organic electronic devices. Some simple OLEDs have the following structure, in order, anode, hole transporting layer, light emitting material layer, electron transporting layer and cathode. Most of the hole transport or electron transport materials, however, have relatively low conductivity due to the intrinsic properties of these charge transport materials. Thus, the performance of the charge injection and transport properties of these materials are limited in achieving high efficiency organic electronic devices. It is also known in the art that the hole transporting and electron transporting materials are generally soluble in common organic solvents, which can make it difficult to use them for multilayer deposition by solution processing.

There is a need for new charge transport layers.

SUMMARY

Provided are p-doped hole transporting layers and n-doped electron transporting layers. Also provided are electronic devices and articles useful in the manufacture of electronic devices comprising such layers.

The foregoing general description and the following detailed description are exemplary and explanatory only and are not restrictive of the invention, as defined in the appended claims.

BRIEF DESCRIPTION OF THE DRAWING

Embodiments are illustrated in the accompanying FIGURE to improve understanding of concepts as presented herein.

Figure 1:
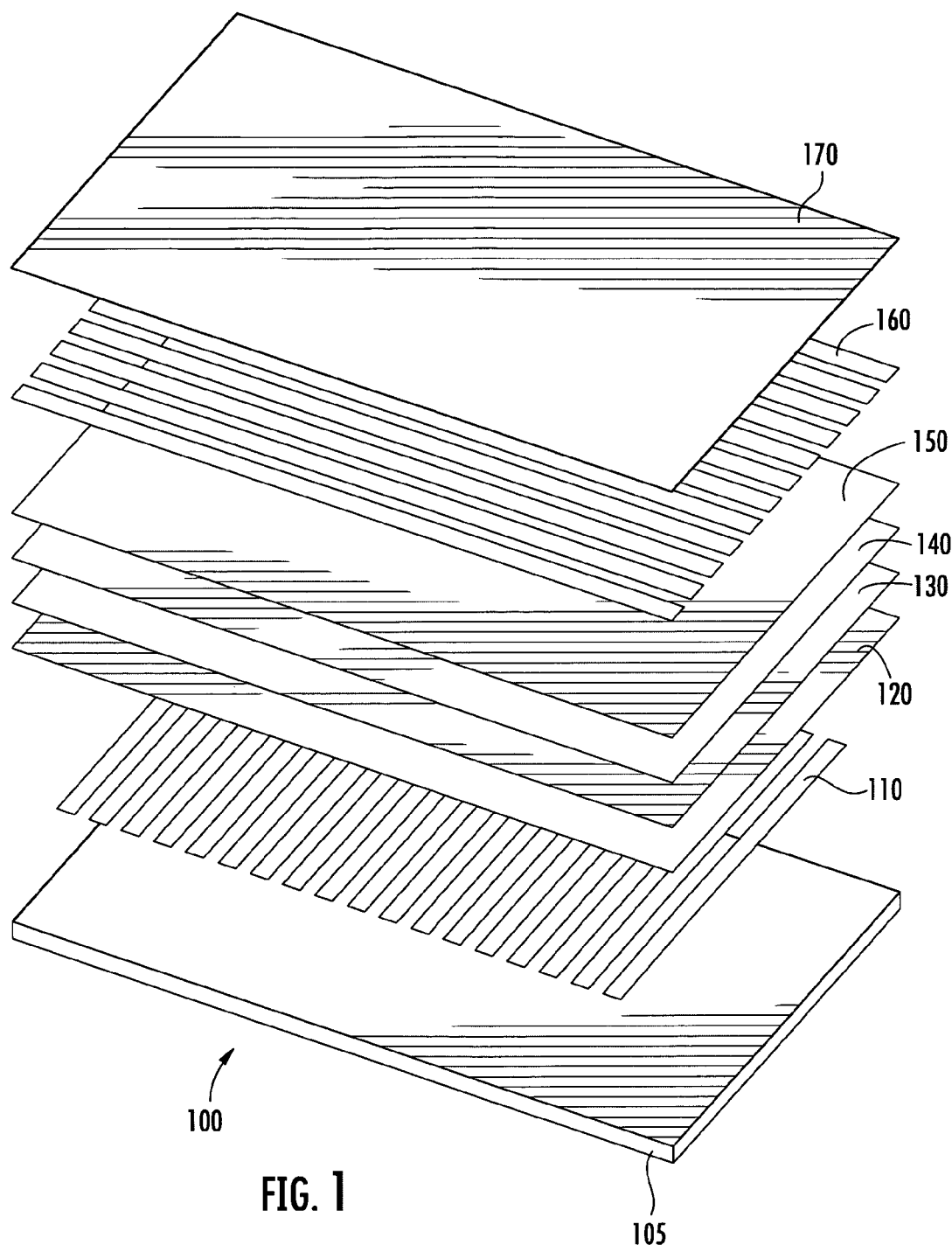
FIG. 1 includes an illustration of one organic electronic device of the instant invention.

The figures are provided by way of example and are not intended to limit the invention. Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Provided are p-doped hole transporting layers and n-doped electron transporting layers. Also provided are electronic devices and articles useful in the manufacture of electronic devices comprising such layers.

In one embodiment, an electronic device is provided comprising a hole transporting layer, a photoactive layer, and an electron transporting layer. In one embodiment, the hole transporting layer comprises a hole transport material doped with a p-dopant. In one embodiment, the hole transporting layer is in contact with one side of the photoactive layer. In one embodiment, the electron transporting layer comprises an electron transport material doped with an n-dopant. In one embodiment, the electron transporting layer is in contact with the opposite side of the photoactive layer. In one embodiment, the hole transport material and the p-dopant are organic materials. In one embodiment, the electron transport material and the n-dopant are organic materials.

In one embodiment, the weight ratio of hole transport material to p-dopant can be in the range of 1:1 to 200:1. In one embodiment, the weight ratio is in the range of 2:1 to 50:1.

In one embodiment, the weight ratio of electron transport material to n-dopant can be in the range of 1:1 to 200:1. In one embodiment, the weight ratio is in the range of 2:1 to 50:1.

Any hole transport material that provides suitable properties can be used in the hole transporting layer. The hole transport material can be a small molecule material, an oligomer, or a polymer.

Any electron transport material that provides suitable properties can be used in the electron transporting layer. The electron transport material can be a small molecule material, an oligomer, or a polymer.

In one embodiment, the p-dopant is a homopolymer or copolymer of an electron deficient molecule. In one embodiment, the p-dopant comprises an electron deficient molecule covalently bonded to an inert polymer chain or large molecule matrix.

In one embodiment, the n-dopant is a homopolymer or copolymer of an electron rich molecule. In one embodiment, the n-dopant comprises an electron rich molecule covalently bonded to an inert polymer chain or large molecule matrix.

Examples of n-dopants include, but are not limited to the following classes:

1. Tetra-Chalcogens:

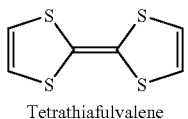
Tetrathiafulvalene
TTF

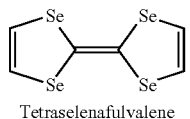
Tetraselenafulvalene
TSF

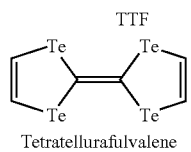
Tetratellurafulvalene
TTeF

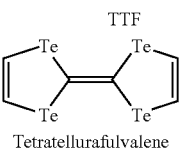
trans-Diselenadithiafulvalene
DSDTF

[2,2′]Bi[benzo[1,3]dithiolytidene]
DBTTF

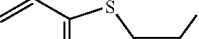
Tetrathionaphthalene
TTN

-continued
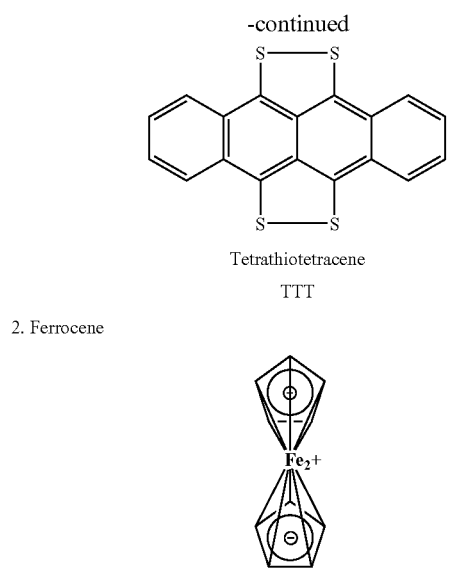
Tetrathiotetracene
TTT
2. Ferrocene
3. Triphenylmethanes and Phenylazomethines
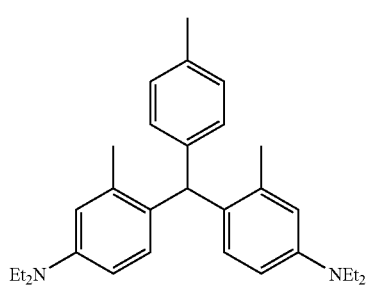
MPMP
DP-G1An
-continued
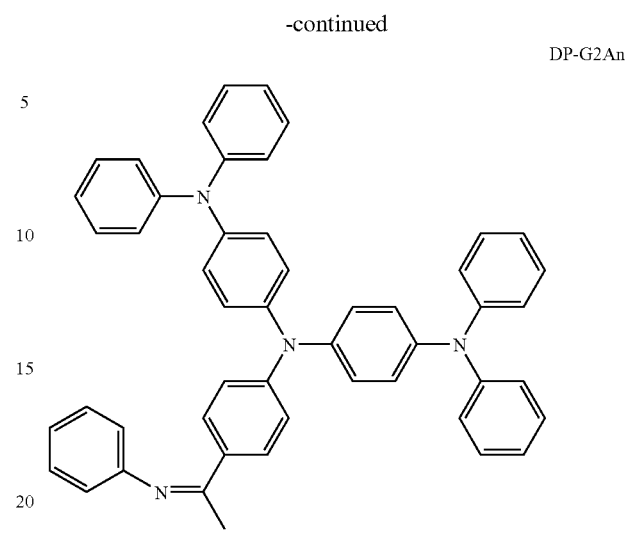
DP-G2An
4. Triarylamines
m-OMTDATA
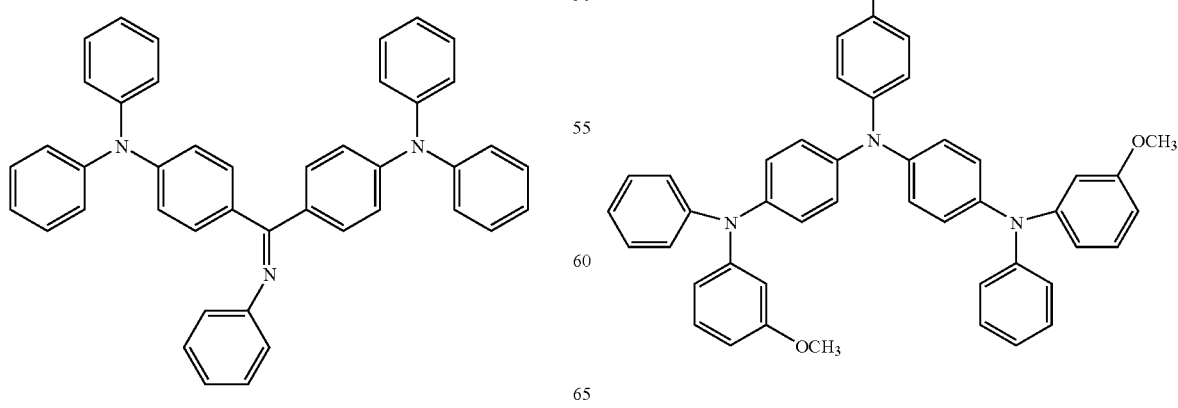

TPD

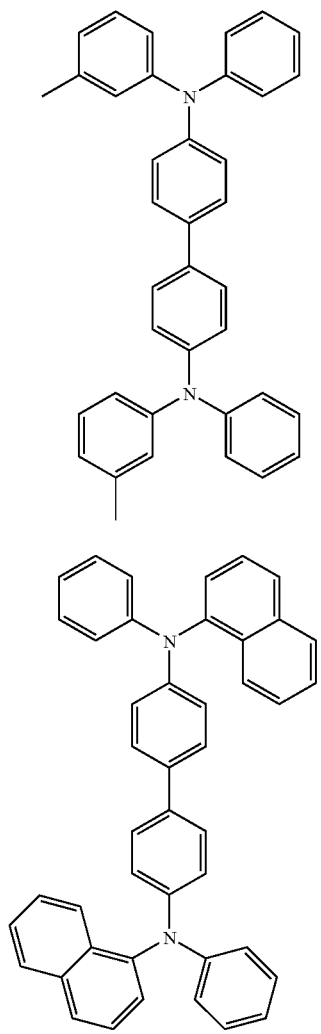

a-NPD m-MTDATA

TCTA

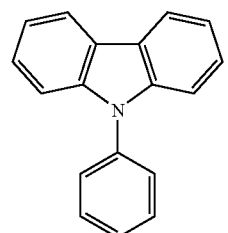

Polyarylamine

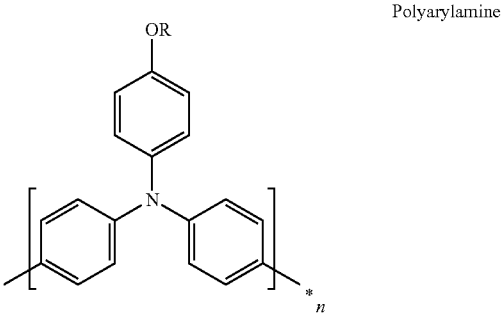

Other arylamine compounds include, but not limited to; 1,1bis[(di-4-tolylamino)phenyl]cyclohexane (TAPC), N,N'bis(4-methylphenyl)-N,N'-bis(4-ethylphenyl)-[1,1'-(3,3'-dimethyl)biphenyl]-4,4'-diamine (ETPD), tetrakis (3-methylphenyl)-N,N,N',N'-2,5-phenylenediamine (PDA), a-phenyl4-N,N-diphenylaminostyrene (TPS), p(diethylamino) benzaldehyde diphenyl hydrazone (DEH), triphenylamine (TPA), 1phenyl-3-[p-(diethylamino)styryl]-5-[p-(diethylamino)phenyl]pyrazoline (PPR or DEASP), N,N,N',N' tetrakis(4-methylphenyl)-(1,1'-biphenyl)-4,4'-diamine (TTB), 5. Phthalocyanines and their Metal Complexes:

MPc

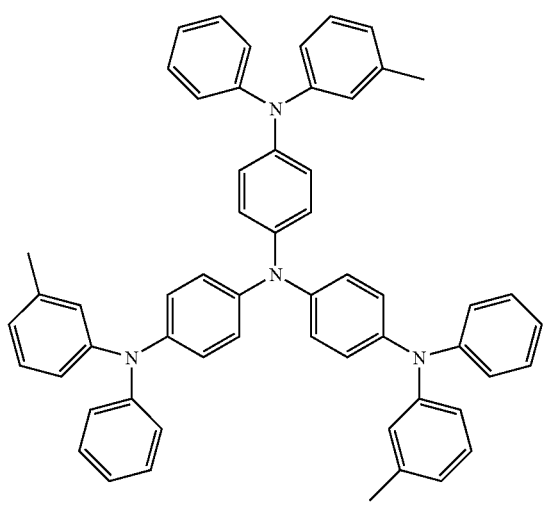

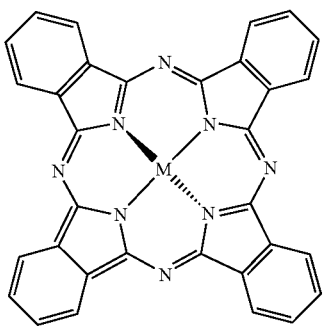

CuPc

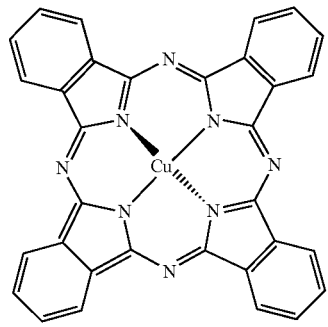

ZnPc

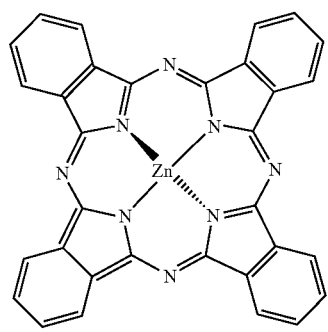

PtOEP

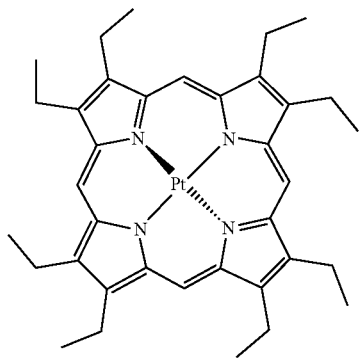

Examples of p-dopants include, but are not limited to, the following classes:

1. Tetracyano Quinods:

TCNQ

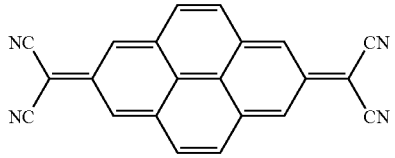

2-(4-Dicyanomethylene-cyclohexa-2,5-dienylidene)-malononitrile

F4-TCNQ

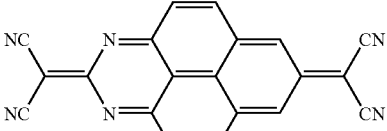

2-(4-Dicyanomethylene-2,3,5,6-tertafluoro-cyclohexa-2,5-dienylidene)-malononitrile

TCPQ

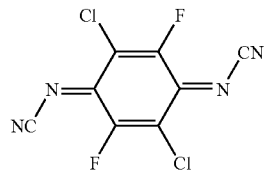

2-(7-Dicyanomethylene-7H-pyren-2-ylidene)-malononitrile

TCPyQ 2-(2-Dicyanomethylene-2H-benzo[gh]permidin-7-ylidene)-malononitrile

TCNQFC

Cyanamide, (2,5-dichloro-3,6-difluoro-2,5-cyclohexadiene-1,4-diylidene)bis-

2. Aromatic Diimide:

NAPHIMDE-Me

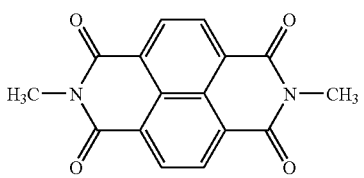

2-7-Dimethyl-benzo[lmn][3,8]phenanthroline-1,3,6,8-tetraone

PERYIMDE-R

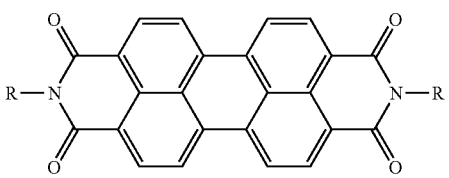

CN-PERYIMDE-R

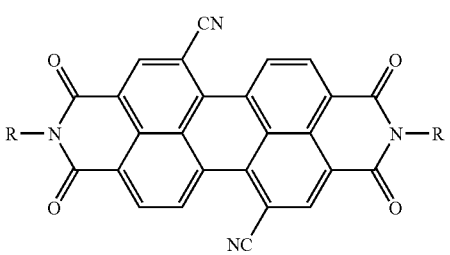

R = Alkyl, aryl

3. Fullerenes:
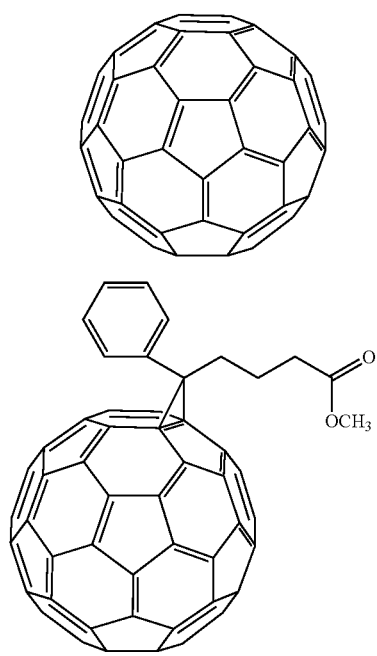
C60
PCBM
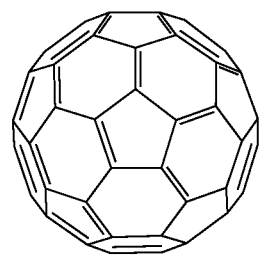
C70
4. Fluorine-Substituted Compounds:
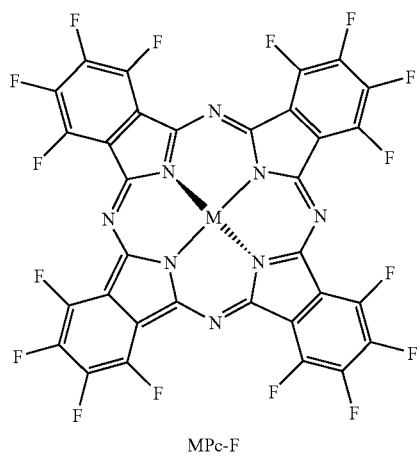
MPc-F
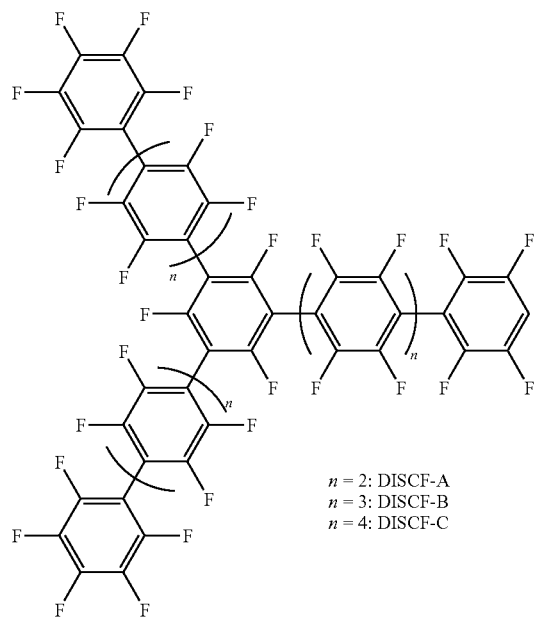
n = 2: DISCF-A
n = 3: DISCF-B
n = 4: DISCF-C
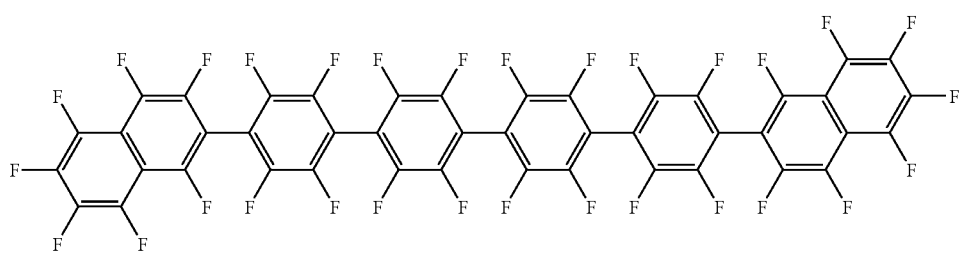
NPF-6

5. Heterocyclic Compounds
TPBI
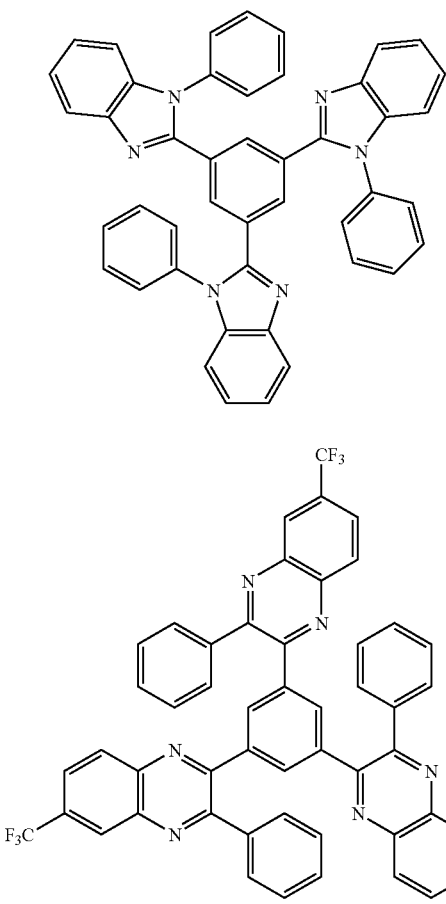
TPQ
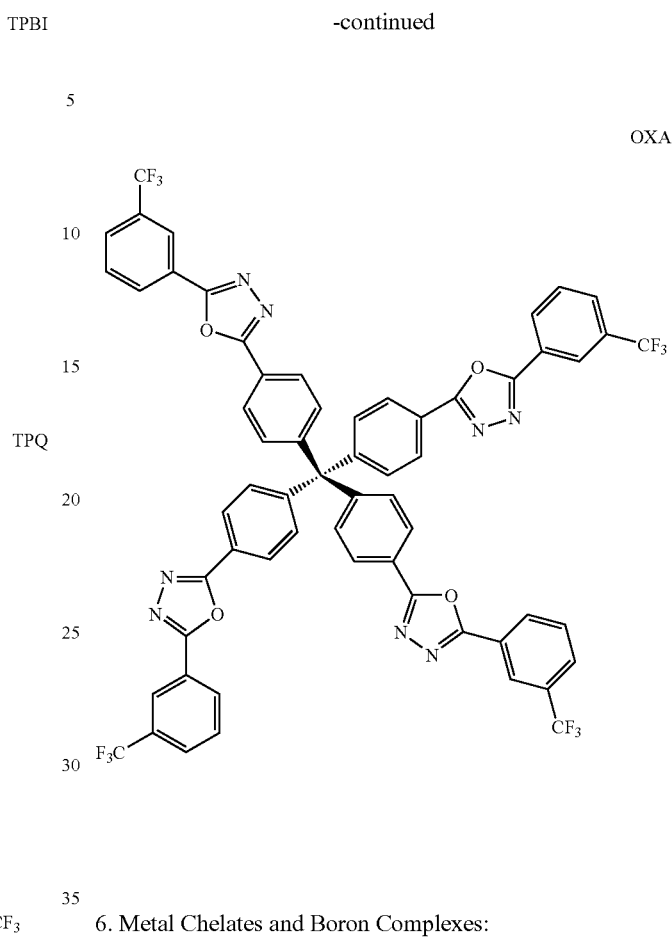
OXA
6. Metal Chelates and Boron Complexes:
BCP
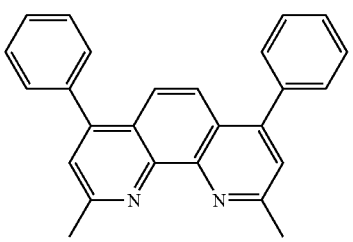
TRZCF3
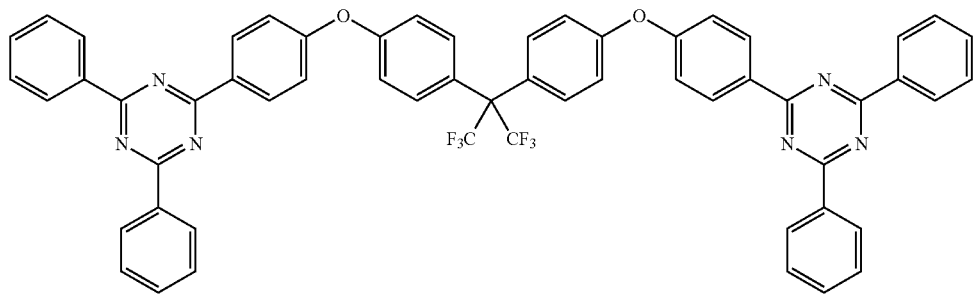

-continued

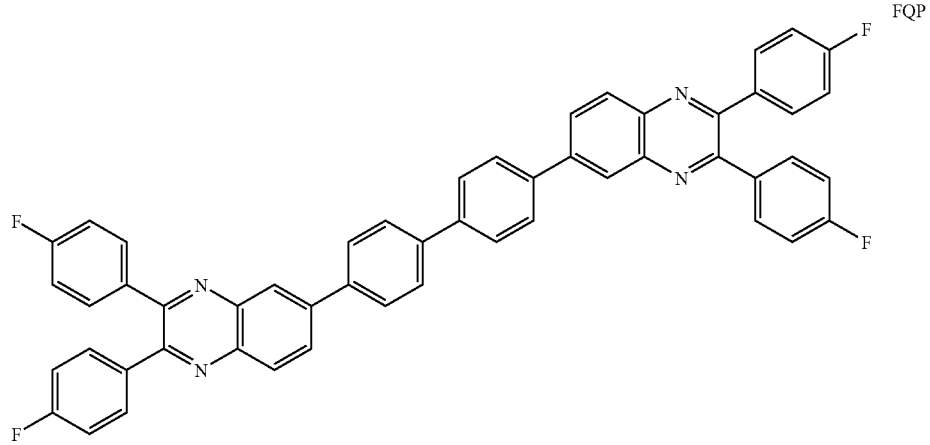

In one embodiment, the organic active layer comprises a polymer layer or small molecule layer. In another embodiment, the polymer is an organic conjugated polymer. In another embodiment, the small molecule is either electro-fluorescent or electro-phosphorescent.

In one embodiment, the cathode is directly deposited onto the n-doped electron transport/injection layer. In one embodiment, an additional electron injection layer can be sandwiched between the cathode and the n-doped electron injection/transport layer. The electron injection layer includes, but is not limited to, BaO, $Li_2O$, LiF, Ba. In one embodiment, the cathode consists essentially of aluminum.

In one embodiment, the p-doped hole injection/transport layer, is directly deposited onto the anode, In one embodiment, a hole injection layer can be sandwiched between the anode and the p-doped hole injection/transport layer. The hole injection layer, or also known as buffer layer, includes, but is not limited to, electrically conducting polymers such as polyanilines, polythiophenes, polypyrroles, and poly(thienothiophenes), which are known in the art. In one embodiment, the photoactive layer is sandwiched between the p-doped hole injection/transport and n-doped electron injection/transport layers.

It should be appreciated that the charge transport material and p-dopant or n-dopant may be deposited together in the layer or separately as one or more sublayers to form organic complexes with p-doped or n-doped dominated forms. This concept is also generally applicable to other layers described herein that comprise more than one material.

In one embodiment, a p-doped hole injection material comprises triarylamine compounds, doped with electron deficient-tetrafluorotetracyanoquinodimethane (F4-TCNQ) or one of its derivatives. In another embodiment, a n-doped electron injection material comprises 4,4'-bis[2,3-(4-fluororphenyl) quinoxaniline-6-yl]biphenyl doped with electron rich tetrathiotetracene (TTT) or one of its derivatives. In another embodiment, a n-doped electron injection material comprises FQP doped with electron rich tetrathiotetracene (TTT) or one of its derivatives.

Any or all of the anode layer, hole transport layer, electron transport layers, and cathode layer can be surface treated.

Some devices include a light-emitting diode, a light emitting diode display, a diode laser, a photodetector, a photoconductive cell, a photoresistor, a photoswitch, a phototransistor, a phototube, an IR detector, a photovoltaic device, a solar cell, a transistor, a diode, a coating material for memory storage devices, an antistatic film, a biosensor, an electrochromic device, a solid electrolyte capacitor, an energy storage device, or an electromagnetic shielding application, or any combinations thereof.

Some organic active layers are light emitting layers. In one embodiment, the organic active layer is a light emitting diode or a light emitting electrochemical cell. In one embodiment, the organic active layer responds to radiant activity and generates a signal with or without an applied bias voltage. Some organic active layers are photodetectors. Certain organic active layers are an organic electroluminescent material, light emitting polymer, or an organometallic complex.

Also provided are articles useful in the manufacture of an organic electronic device comprising at least one p-doped hole injection/transport layer and one n-doped electron injection/transport layer disclosed herein. Such articles can be used in the manufacture of organic electronic devices. The articles can contain additional layers that are useful in an organic electronic device.

Also provided is a method of making an p-doped hole injection/transport layer comprising depositing a hole transporting material doped with at least p-dopant on an anode. In another embodiment, the p-dopant can be separately deposited on the hole transporting layer. Also provided is a method of making an n-doped electron injection/transport layer comprising depositing an electron transporting material doped with at least one n-dopant on a photoactive layer. In another embodiment, the n-dopant can be deposited separately on the electron-transporting layer.

Any solution pattering method and device used in the art can be used for the making of such layers. These devices use a variety of techniques, including sequentially depositing the individual layers on a suitable substrate. Substrates such as glass and polymeric films can be used. Conventional vapor deposition techniques can be used, such as thermal evaporation, chemical vapor deposition, and the like. Alternatively, the organic layers can be applied by liquid deposition using suitable solvents. The liquid can be in the form of solutions, dispersions, or emulsions. Typical liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing; any conventional coating or printing technique, including but not limited to spin-coating, dip-coating, roll-to-roll techniques, ink-jet printing, screen-printing, gravure printing and the like.

In one embodiment, an ink jet printing method is used. In one embodiment, a nozzle printer application is used.

Any solvent may be used that solubilizes the photoactive material. In one embodiment, the solvent is preferably an aprotic solvent. In one embodiment, the solvent is an aromatic hydrocarbon. In one embodiment, the aprotic organic solvent is toluene, xylene, mesitylene, anisole, chlorobenzene, cyclohexanone, gamma-valerolactone, or chloroform, or derivatives thereof. In one embodiment, the solvent is toluene.

In one embodiment, the electronic device is made by the solution deposition of the organic layers. In one embodiment, the p-doped hole transporting layer is not soluble or only sparingly soluble in the solvent used to deposit the photoactive layer. In another embodiment, the photoactive layer is not soluble or only sparingly soluble in the solvent used to deposit n-doped electron transporting layer.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Illustrative Organic Electronic Devices, and finally the Examples.

DEFINITIONS AND CLARIFICATION OF TERMS

Before addressing details of embodiments described below, some terms are defined or clarified.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode). The term device also includes coating materials for memory storage devices, antistatic films, biosensors, electrochromic devices, solid electrolyte capacitors, energy storage devices such as a rechargeable battery, and electromagnetic shielding applications.

As used herein, the term "charge transport" or "charge transporting," when referring to a layer or material is intended to mean such layer or material facilitates migration of such charge through the thickness of such layer, material, member, or structure with relative efficiency and small loss of charge, and is meant to be broad enough to include materials that may act as a hole transport or an electron transport material. The term "electron transport" or "electron transporting," when referring to a layer or material means such a layer or material, member or structure that promotes or facilitates migration of electrons through such a layer or material into another layer, material, member or structure. The term "hole transport" or "hole transporting," when referring to a layer or material means such a layer or material, member or structure that promotes or facilitates migration of positive charge through such a layer or material into another layer, material, member or structure.

As used herein, the term "photoactive" refers to a material that emits light when activated by an applied voltage (such as in a light-emitting diode or light-emitting electrochemical cell), or responds to radiant energy and generates a signal with or without an applied bias voltage (such as in a photodetector). An example of a photoactive layer is an emitter layer.

The term "active" when referring to a layer or material is intended to mean a layer or material that exhibits electronic or electro-radiative properties. An active layer material may emit radiation or exhibit a change in concentration of electron-hole pairs when receiving radiation. Thus, the term "active material" refers to a material which electronically facilitates the operation of the device. Examples of active materials include, but are not limited to, materials which conduct, inject, transport, or block a charge, where the charge can be either an electron or a hole. Examples of inactive materials include, but are not limited to, planarization materials, insulating materials, and environmental barrier materials.

The term "directly on" when referring to one layer with respect to another layer, means that there is substantially no intervening material between the two layers.

The term "small molecule" is intended to mean a compound having a molecular weight no greater than approximately $10^4$ g/mol.

The term "n-dopant" is intended to mean a compound which is electron rich and capable of donating an electron.

The term "p-dopant" is intended to mean a compound which is electron deficient and capable of accepting an electron.

The term "$n^+$ doped" or "$p^+$ doped," with respect to a material, layer, or region is intended to mean such material, layer, or region includes an n-type or p-type dopant, respectively.

The term "layer" is used interchangeably with the term "film" and refers to a coating covering a desired area. The area can be as large as an entire device or a specific functional area such as the actual visual display, or as small as a single sub-pixel. Films can be formed by any conventional deposition technique, including vapor deposition and liquid deposition. Liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing.

The term "substrate" is intended to mean a workpiece that can be either rigid or flexible and may include one or more layers of one or more materials, which can include, but are not limited to, glass, polymer, metal, or ceramic materials, or combinations thereof.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The use of "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

Device

Referring to FIG. 1, an exemplary organic electronic device 100 is shown. The device 100 includes a substrate 105. The substrate 105 may be rigid or flexible, for example, glass, ceramic, metal, or plastic. When voltage is applied, emitted light is visible through the substrate 105.

A first electrical contact layer 110 is deposited on the substrate 105. For illustrative purposes, the layer 110 is an anode layer. Anode layers may be deposited as lines. The anode can be made of, for example, materials containing or comprising metal, mixed metals, alloy, metal oxides or mixed-metal oxide. The anode may comprise a conducting polymer, polymer blend or polymer mixtures. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also comprise an organic material, especially a conducting polymer such as polyaniline, including exemplary materials as described in *Flexible Light-Emitting Diodes Made From Soluble Conducting Polymer, Nature* 1992, 357, 477-479. At least one of the anode and cathode should be at least partially transparent to allow the generated light to be observed.

An optional buffer layer not shown in FIG. 1, may be deposited over the anode layer 110, the latter being sometimes referred to as the "hole-injecting contact layer." prior to deposition of p-doped hole injection/transport layer 120. Examples of hole transport materials are described therein as electron donors for forming charge transfer complexes with electron acceptors. The preferred hole transporting materials for forming charge transfer complexes with an electron acceptor are amine-based materials. Suitable for use as the layer 120 are also summarized, for example, in Kirk Othmer, Encyclopedia of Chemical Technology, Vol. 18, 837-860 ($4^{th}$ ed. 1996).

A photoactive layer 130 is deposited over the p-doped hole injection/transport layer 120. In some embodiments, the organic layer 130 may be a number of discrete layers comprising a variety of components. Depending upon the application of the device, the organic layer 130 can be a light-emitting layer that is activated by an applied voltage (such as in a light-emitting diode or light-emitting electrochemical cell), or a layer of material that responds to radiant energy and generates a signal with or without an applied bias voltage (such as in a photodetector).

Other layers in the device can be made of any materials which are known to be useful in such layers upon consideration of the function to be served by such layers.

Any organic electroluminescent ("EL") material can be used as a photoactive material (e.g., in layer 130). Such materials include, but are not limited to, fluorescent dyes, small molecule organic fluorescent compounds, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In one embodiment of the devices of the invention, photoactive material can be an organometallic complex. In another embodiment, the photoactive material is a cyclometalated complex of iridium or platinum. Other useful photoactive materials may be employed as well. Complexes of iridium with phenylpyridine, phenylquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in *Synth. Met.* 2001, 116 (1-3), 379-383, and Campbell et al., in Phys. Rev. B, Vol. 65 085210.

A second electrical contact layer 160 is deposited on the photoactive layer 130. For illustrative purposes, the layer 160 is a cathode layer.

Cathode layers may be deposited as lines or as a film. The cathode can be any metal or nonmetal having a lower work function than the anode. Exemplary materials for the cathode can include alkali metals, especially lithium, the Group 2 (alkaline earth) metals, the Group 12 metals, including the rare earth elements and lanthanides, and the actinides. Materials such as aluminum, indium, calcium, barium, samarium and magnesium, as well as combinations, can be used. Lithium-containing and other compounds, such as LiF and $Li_2O$, may also be deposited between an organic layer and the cathode layer to lower the operating voltage of the system.

A n-doped electron injection/transport layer 140 or electron injection layer 150 is optionally disposed adjacent to the cathode, the cathode being sometimes referred to as the "electron-injecting contact layer." Examples of n-doped electron/transport materials are described therein as electron acceptors for forming charge transfer complexes with electron donors. The optional electron injection layer comprises, but not limited to, BaO, $Li_2O$, LiF, Barium.

An encapsulation layer 170 is deposited over the contact layer 160 to prevent entry of undesirable components, such as water and oxygen, into the device 100. Such components can have a deleterious effect on the organic layer 130. In one embodiment, the encapsulation layer 170 is a barrier layer or film.

Though not depicted, it is understood that the device 100 may comprise additional layers. For example, there can be a buffer layer (not shown) between the anode 110 and hole transport layer 120 to facilitate positive charge transport and/or band-gap matching of the layers, or to function as a protective layer. Other layers that are known in the art or otherwise may be used. In addition, any of the above-described layers may comprise two or more sub-layers or may form a laminar structure. Alternatively, some or all of anode layer 110 the p-doped hole injection/transport layer 120, the n-doped electron injection/transport layers 140 and electron injection 150, cathode layer 160, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; p-doped hole injection/transport layer 120, 50-2000 Å; in one embodiment 200-1000 Å; photoactive layer 130, 10-2000 Å, in one embodiment 100-1000 Å; layers 140 and 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

Devices can be prepared employing a variety of techniques. These include, by way of non-limiting exemplification, vapor deposition techniques and liquid deposition. Devices may also be sub-assembled into separate articles of manufacture that can then be combined to form the device.

EXAMPLES

The concepts described herein will be further described in the following examples, which do not limit the scope of the invention described in the claims.

Example 1

This example illustrates a p-doped hole injection material (or complex):

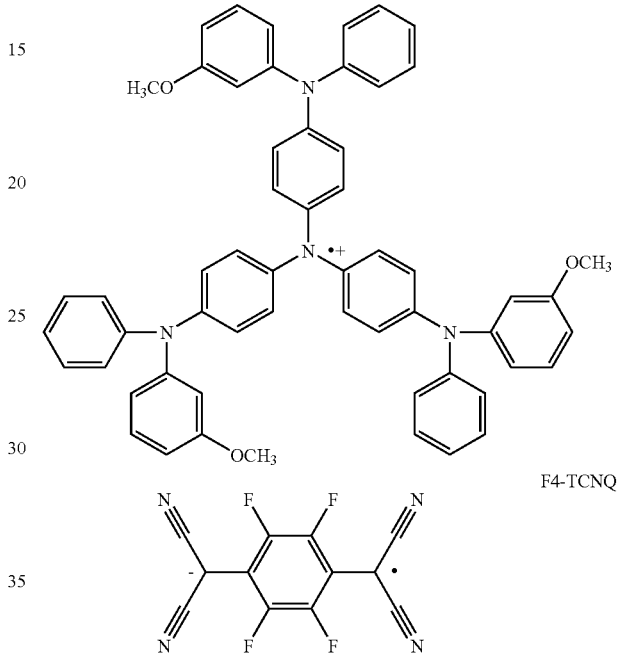

In the above case hole transport material m-OMTDATA is doped with electron deficient F4-TCNQ in a ratio of 2~200:1 to form a p-doped hole injection material. The complex in various ratio will be tested for solubility in various solvents other than the common organic solvents for photoactive materials.

Example 2

This example illustrates a n-doped electron injection material:

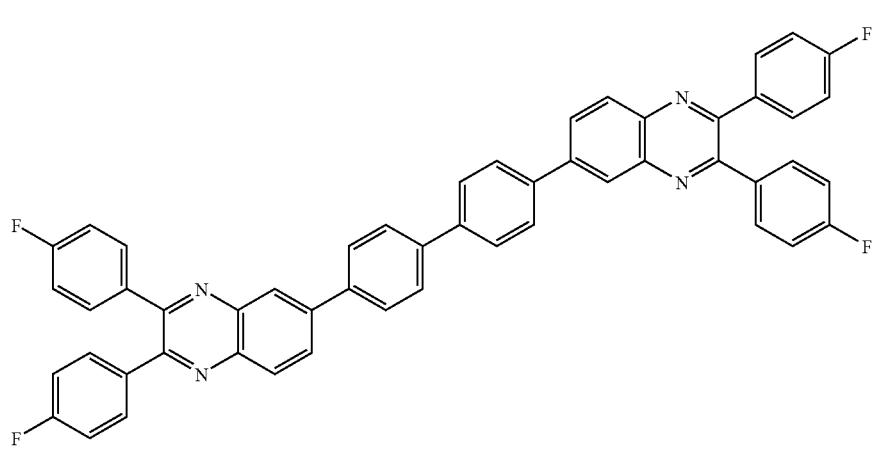

TTT

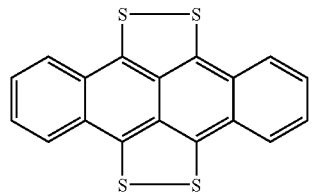

In the above case electron transport material FQP is doped with electron rich TTT in a ratio of 2~200:1 to form a n-doped electron injection material. The complex in various ratio will be tested for solubility in various solvents other than the common organic solvents for photoactive materials.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Many aspects and embodiments have been described above and are merely exemplary and not limiting. After reading this specification, skilled artisans appreciate that other aspects and embodiments are possible without departing from the scope of the invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. An organic n-doped electron transport layer comprising a compound of the formula:

FQP

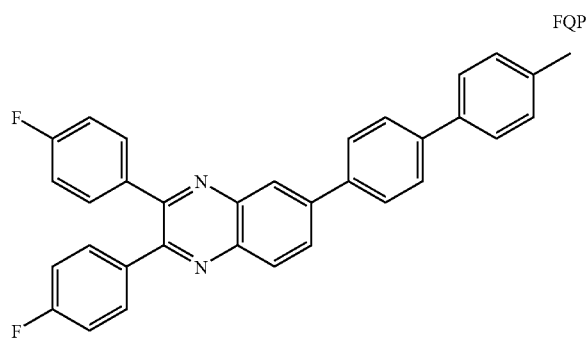

-continued

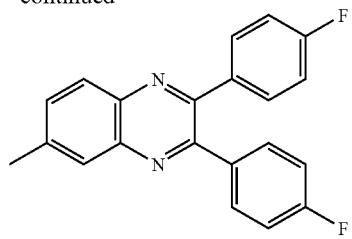

doped with tetrathiotetracene (TTT) or one of its derivatives.

2. The layer of claim 1 wherein FQP and TTT are deposited together within the electron transport layer.

3. The layer of claim 1 wherein FQP and TTT are deposited separately, each as one or more sub-layers within the electron transport layer.

4. An organic electronic device comprising an anode, an organic active layer, a cathode, and the electron transport layer of claim 1.

5. The organic electronic device of claim 4 wherein FQP and TTT are deposited together within the electron transport layer.

6. The organic electronic device of claim 4 wherein FQP and TTT are deposited separately, each as one or more sub-layers within the electron transport layer.

7. An organic electronic device comprising in order: an anode, a hole transport layer comprising at least one hole transport material and at least one electron deficient dopant material, a photoactive layer, an electron transport layer of claim 1, and a cathode.

8. The device of claim 7 wherein the photoactive layer is directly on the hole transport layer and the electron transport layer is directly on the photoactive layer.

9. An article useful in the manufacture of an organic electronic device comprising at least one electron transport layer of claim 1.

10. The article of claim 9 additionally comprising at least one hole transport layer comprising at least one hole transport material and at least one electron deficient dopant material.

11. A method of making a layer comprising:
providing a solution comprising a compound of the formula:

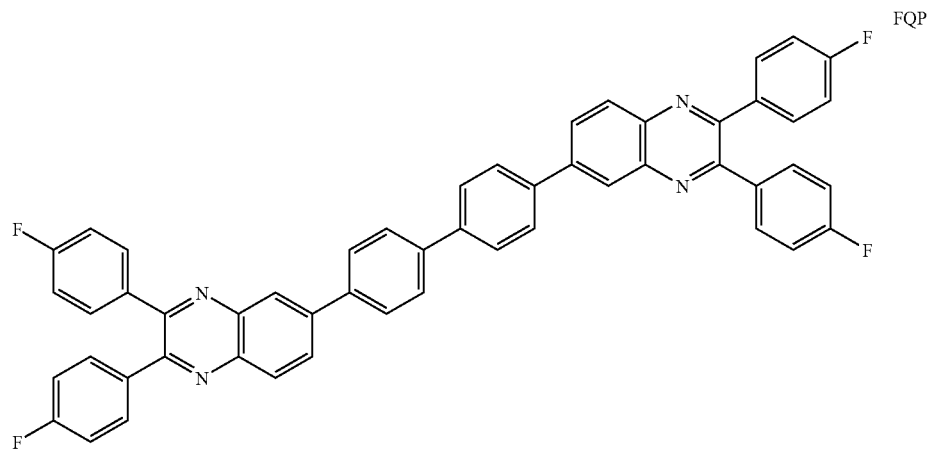
and tetrathiotetracene (TTT) in an organic solvent;
applying the solution to a substrate; and
removing at least a portion of the solvent.
\* \* \* \* \*